(12) United States Patent
Ramm et al.

(10) Patent No.: US 10,604,835 B2
(45) Date of Patent: Mar. 31, 2020

(54) MACROPARTICLE FILTER DEVICE AND METHOD FOR USE IN CATHODIC ARC DEPOSITION

(71) Applicant: Oerlikon Surface Solutions AG, Pfaffikon, Pfaffikon (CH)

(72) Inventors: Juergen Ramm, Maienfeld (CH); Beno Widrig, Bad Ragaz (CH); Richard Rachbauer, Feldkirch (AT)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 0 days.

(21) Appl. No.: 15/628,904

(22) Filed: Jun. 21, 2017

(65) Prior Publication Data

US 2018/0002805 A1    Jan. 4, 2018

(30) Foreign Application Priority Data

Jun. 29, 2016 (EP) .................................... 16001452

(51) Int. Cl.
  *H01J 37/34* (2006.01)
  *C23C 14/22* (2006.01)
  (Continued)

(52) U.S. Cl.
  CPC .......... *C23C 14/22* (2013.01); *C23C 14/0605* (2013.01); *C23C 14/067* (2013.01);
  (Continued)

(58) Field of Classification Search
  CPC ............ C23C 14/0605; C23C 14/0641; C23C 14/067; C23C 14/14; C23C 14/22; C23C 14/325; C23C 14/564; H01J 37/32055; H01J 37/32422; H01J 37/32614; H01J 37/32853; H01J 37/32871; H01J 37/34; H01M 4/02; H01M 2004/028
  USPC ........................... 204/192.38, 298.41, 298.11
  See application file for complete search history.

(56) References Cited

U.S. PATENT DOCUMENTS 4,051,010 A * 9/1977 Roth ..................... C23C 14/505
                                                 204/298.11
4,452,686 A    6/1984 Axenov
                (Continued)

FOREIGN PATENT DOCUMENTS

| CN | 202022974 U | 11/2011 |
|---|---|---|
| JP | 2006-312764 A | 11/2006 |
| WO | 2009/122233 A1 | 10/2009 |

OTHER PUBLICATIONS

Anders, "Cathodic Arcs" Plasma Applications Group, Berkeley, CA, 2008.

*Primary Examiner* — Rodney G McDonald
(74) *Attorney, Agent, or Firm* — Pearne & Gordon LLP

(57) ABSTRACT

A macroparticle filter device for cathodic arc evaporation, to be placed between at least one arc evaporation source and at least one substrate exhibiting at least a surface to be coated with material evaporated from a cathode of the arc evaporation source in a vacuum coating chamber. The macroparticle filter device includes one or more filter components that can prevent macroparticles emitted by the cathode during cathodic arc evaporation to arrive the substrate surface to be coated. The at least one component is provided as one or more flexible sheets that block the lineal way of the macroparticles from the cathode to the substrate surface to be coated. Further a method for utilizing the macroparticle filter device is presented.

18 Claims, 6 Drawing Sheets

Figure 1:
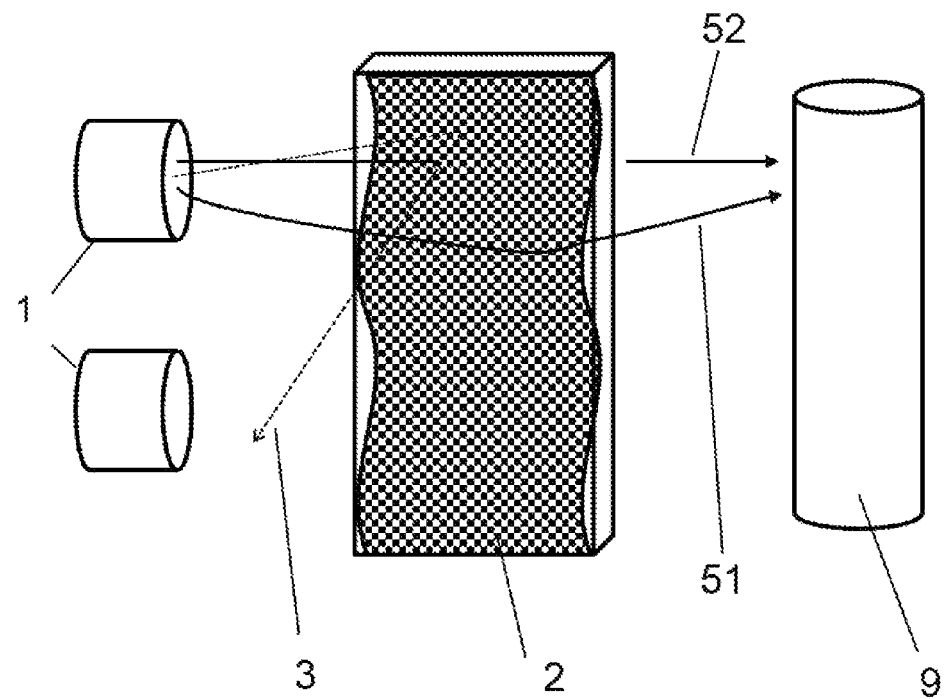

(51) Int. Cl.
    *H01J 37/32*     (2006.01)
    *C23C 14/56*     (2006.01)
    *C23C 14/32*     (2006.01)
    *C23C 14/06*     (2006.01)
    *C23C 14/14*     (2006.01)
    *H01M 4/02*     (2006.01)

(52) U.S. Cl.
    CPC .......... *C23C 14/0641* (2013.01); *C23C 14/14* (2013.01); *C23C 14/325* (2013.01); *C23C 14/564* (2013.01); *H01J 37/32055* (2013.01); *H01J 37/32422* (2013.01); *H01J 37/32614* (2013.01); *H01J 37/32853* (2013.01); *H01J 37/32871* (2013.01); *H01J 37/34* (2013.01); *H01M 4/02* (2013.01); *H01M 2004/028* (2013.01)

(56) References Cited

U.S. PATENT DOCUMENTS

| | | | | |
|---|---|---|---|---|
| 4,511,593 | A * | 4/1985 | Brandolf | ................ C23C 14/32 118/50.1 |
| 5,279,723 | A | 1/1994 | Falabella | |
| 5,317,235 | A | 5/1994 | Treglio | |
| 6,428,659 | B2 * | 8/2002 | Chou | ................... C23C 14/022 204/192.16 |
| 6,465,780 | B1 | 10/2002 | Anders | |
| 6,572,744 | B1 * | 6/2003 | Paranjpe | ............... C23C 14/046 204/298.06 |
| 2002/0074226 | A1 * | 6/2002 | Murakami | ........ H01J 37/32055 204/298.41 |
| 2007/0034501 | A1 | 2/2007 | Bender | |

\* cited by examiner

MACROPARTICLE FILTER DEVICE AND METHOD FOR USE IN CATHODIC ARC DEPOSITION

The present invention relates to a macroparticle filter device located between cathode and substrate and blocking the direct line-of-sight for macroparticles, comprising at least one flexible filter component with one or more non-transparent foils or flexible semitransparent net, both thermally stable and having a surface characterized by a low sticking coefficient for macroparticles, used for efficient droplet reduction during arc deposition of all kind of coatings on technical substrates.

The present invention relates furthermore to a coating method for deposition of coatings on substrates by arc deposition, using the aforementioned device.

STATE OF THE ART

The high degree of ionized particles generated by cathodic arc evaporation ensure the growth of dense coatings with outstanding properties. However, the operation of the cathodic arc at a target surface also generates macroparticles which are emitted as well towards the substrate surface and can be incorporated in the coating. These macroparticles are usually undesirable because they reduce the mechanical and thermal stability of the synthesized coatings.

During the past decades extensive academic and industrial research has been addressed to understand and control the generation of macroparticles during the deposition process by cathodic arc evaporation. A thorough review on the physical origin of macroparticles can be found in literature as e.g. by A. Anders, in Cathodic Arcs, DOI:10.1007/978-0-387-79108-1_6, page 265 ff. Generally, the formation of a pool of liquid cathode material and the explosive plasma formation are regarded to result in the emission of neutral atoms, ions, electrons, as well as liquid and/or solid particles.

As commonly accepted, the evaporation behavior of different cathode or target elements strongly depends on their melting temperatures ($T_m$), which in turn can be understood as a function of their cohesive energy. The average burning voltage of a vacuum arc at a given current is more or less directly proportional to the cohesive energy of the cathode material. This implies that for materials with high $T_m$ a high energy has to be provided to the local arc spot in order to melt the material and generate a local plasma and vice versa. As a rule of thumb at a given arc current, the arc evaporation of low-$T_m$ elements can be found to result in the emission of a higher amount of liquid droplets, compared to high-$T_m$ elements which are prone to emit a higher degree of solid particles. The observation for high-$T_m$ target materials is related to the fact that also the Young's modulus is a function of the cohesive energy of the material. Hence, the generation of local melting pools and the explosive plasmas leads to "brittle" failure of the target material in the direct vicinity of the arc spot due to thermal shock, thus emitting a higher amount of solid particles.

In the present invention the term "macroparticle" should thus be understood as essentially "everything" that is emitted from the cathode surface during arc deposition, except neutral atoms, ions and electrons. Thus the term macroparticle especially includes liquid and solid species, which are emitted in an arbitrary angle from the target (or cathode) surface. Macroparticles thus also covers the often used synonyms such as "droplets" or "splashes" for liquid, as well as "microparticle" or "nanoparticle", respectively for the solid particles, which only give a hint on the size of the emitted particles but remain "macroparticles" from their physical nature.

Commonly the high energy of the condensing atoms or ions, stemming from arc processes, on the substrate surface is well acknowledged as it is responsible for good adhesion and further promotes the growth of dense films. Additional application of bias voltage allows for a high degree of versatility with respect to select and adjust the impact energy of originally ionized target species and/or reactive gas ions, such as nitrogen, oxygen or comparable gaseous ionized species.

There are essentially two approaches to enhance the amount of arriving atoms and ions on the substrate compared to the diverse types of macroparticles described above.

In the first approach the cathode (also called target) surface reactions during the arc process are in focus. Exemplarily the following parameters can be adapted individually or in combination in order to achieve a homogenous erosion of the target material with as little as possible marcoparticle emission:

arc current level and discharge type (such as e.g. direct current, pulsed dc, or related techniques), magnetic field arrangement used for control of the arc motion on the target, target material and properties (e.g. melting point, grain size; use of compound targets composed of multi-element mixtures and their individual phases, . . . ), gas pressure and regulation, hereby especially reactive gas control of e.g. oxygen or nitrogen.

The second approach attempts to effectively filter the inevitably generated macroparticles from plasma species on their way to the substrate. By blocking the line-of-sight from the target surface towards the substrate, numerous different filter techniques are known to persons skilled in the art, only mentioning exemplarily:

tubular or straight filters (e.g. U.S. Pat. Nos. 4,452,686, 5,317,235), bent filters and/or ducts with different bending angles from ~20 to ~90° (e.g. U.S. Pat. No. 5,279,723), double bent or twisted filters with more than 90° bending angles (e.g. U.S. Pat. No. 6,465,780), magnetic reflection configurations (e.g. US20070034501, linear filters with Venetian blinds, or filter mesh (e.g. WO2009122233; CN202022974)

rotating blade filters (e.g. JP2006312764).

Mostly the utilization of magnetic fields allows for an effective separation of charged plasma particles from the liquid or solid macroparticles, as can be read in the given references above. There are however some severe drawbacks for industrial applications of complex magnetic filter assemblies, where the degree of efficiency of the macroparticle filter scales almost directly proportional with their high costs and the technological effort. At the same time the deposition rate drops inversely proportional to the efficiency of the macroparticle filter.

Alternatively mechanical filters, such as Venetian blind or rotating blade filters, are nowadays known. In the case of rotating blade filters, as disclosed in JP2006312764, the macroparticles are assumed to be partially reflected on their way from the target towards the substrate, which lowers but does not fully prevent the arrival of macroparticles in the growing film. The rotating blade assembly is further not suitable for large scale industrial deposition coaters, where e.g. hundreds of cutting tools are supposed to be rotatable mounted and coated in a single batch.

A combination of mechanical and magnetic field approach using Venetian blinds was proposed in WO2009122233, where a frame of parallel lamellas was arranged in order to partially block the line-of-sight in direction of the plasma flow from the target to the substrate. It was further disclosed that applying an additional current on the lamellas, each directly adjacent lamella with opposite current direction, created an electromagnetic field that enhanced the plasma flow through the Venetian blind filter to the substrate. Although addressing the need for industrial-scale deposition rates, it was mentioned that the material of the Venetian blind needs to be highly stable with respect to thermal expansion during operation in order to ensure stable filter conditions during operation. Further it is disclosed that the critical angle, where macroparticles are expected to hit the lamellas of the Venetian blind, can be understood as a function of depth and spacing between the lamellas. This however has thus a strong impact on the efficiency of the whole filter assembly without avoiding the fact that macroparticles can be emitted also at an angle larger than the described critical angle and are thus not effectively blocked from the substrate. Further, multiple collisions of high-energy macroparticles between the lamellas can lead to forward scattering of macroparticles towards the substrate, which can be understood as a significant drawback of this particular method.

An akin approach, combining magnetic and mechanical filters, is disclosed in the Chinese utility model CN202022974, where the mechanical filter is composed of one mesh filter screen, shielding the arc source towards the substrate and acting similar to above mentioned Venetian blind filter, and a magnetic filter coil which is installed inside the arc source assembly in order to accelerate and redirect the emitted metal particles towards the inner wall of the arc source.

The above mentioned mechanical filter approaches including the above mentioned mechanical filter composed of one mesh filter screen have in common that the reduction of macroparticles occurs by impact collisions of the macroparticles with the solid mechanical filters, whereby the macroparticles are repelled from the rigid surface of the filter elements, such as the above mentioned blades, lamellas or mesh.

It seems that the state of the art vacuum arc filter techniques attempt to combine the high energy of the condensing atoms or ions on the substrate surface, being responsible for good adhesion and densification, with extremely low surface roughness of the growing coating, in order to meet the eagerly growing demands in high-end applications. As for instance in automotive business, cutting technology, forming operations, aerospace or even electronics, require high-quality coatings with low amounts of growth defects, which among other reasons mostly result from macroparticles. In e.g. automotive business the tribological contact conditions require excellent mechanical properties of the protective coating exhibiting simultaneously low friction coefficients. Similarly, cutting or forming tools exhibit constantly growing demands in the surface quality of the protective coatings, in order to sustain the aggressive surface contact conditions during operation.

In this regard, many different functional coating types and compositions, involving elemental carbon, nitrides, carbides, oxides or borides of various metals, as well as their combinations, can be considered as possible solutions for high-end applications mentioned above.

However, there are still at least two important disadvantages of using the above mentioned filter approaches. Although in some of these filter designs the direct line-of-sight from the target surface towards the substrate is fully blocked, usually some of the macroparticles still reach the substrate surface. This is due to the fact, that especially hard solid macroparticles experience multiple scattering at the rigid surfaces of the filter, the chamber walls, other components in the vacuum chamber as well as gas scattering. In many cases a consequence of this scattering is a breaking-up of the particles in such of smaller sizes which undergo additional scattering events. The reason for this is, that the particles have high kinetic energy which is reduced only by a small amount if the marcroparticle is scattered from a rigid surface because only little energy is transferred to such a surface. Another disadvantage of many filter designs is the costly removal of particles which adhere at the filter surface and which change the filter properties.

OBJECTIVE OF THE INVENTION

It is an objective of the present invention to provide a macroparticle filter device for arc deposition processes, which allows to overcome the above mentioned limitations of state-of-the-art vacuum arc processes.

Concretely a macroparticle filter device for arc deposition processes according to the present invention should firstly enable to reduce the amount of macroparticles. and without significantly lowering the deposition rates, compared to arc deposition processes using mechanical filter approaches according to the above mentioned state of the art.

Preferably a macroparticle filter device according to the present invention should also enable to reduce the time of maintenance of the macroparticle filter device in comparison with mechanical filter approaches according to the above mentioned state of the art.

DESCRIPTION OF THE PRESENT INVENTION

The objective of the present invention is attained by providing a macroparticle filter device for cathodic arc evaporation, to be placed between at least one arc evaporation source and at least one substrate with at least a surface to be coated with material evaporated from the respective cathode of the arc evaporation source in a vacuum coating chamber, wherein the filter device comprises at least one filter component that can prevent macroparticles emitted by the cathode during cathodic arc evaporation to arrive the substrate surface to be coated, characterized in that, the filter component is a flexible foil or a flexible net comprising at least one flexible net layer, exhibiting thermal stability at process temperature.

The at least one filter component can be made of one or more materials which exhibit thermal stability at least at the process temperature attained during cathodic arc evaporation. Due to the high versatility of the disclosed flexible filter device for many arc processes, the inventors found that even processes at room temperature, meaning without additional heating during deposition, are possible. For this reason, the filter component is preferably made of one or more materials exhibiting thermal stability above 50° C., more preferably above 300 C, and most preferably, above 600° C. depending on the temperature to be attained during the coating process.

Further, the term flexible filter component should be understood to involve a frame construction and one or more flexible sheets that block the lineal way of the macroparticles from the cathode to the substrate surface to be coated.

The at least one flexible sheet can be provided by e.g. a flexible foil or flexible net layer, which are preferably made of a material exhibiting low- or even anti-sticking properties in relation to the material to be evaporated from the cathode (following called cathode material). With the term "anti-sticking" or "non-sticking" in the context of the present invention it is meaning in particular a low sticking coefficient with respect to the cathode material, so that at least the majority of the macroparticles emitted by the cathode does not adhere to the flexible foil or the flexible net layer. Preferably, the sticking coefficient in this regard should be so low that basically no macroparticles adhere to the foil or the flexible net layer.

The flexible foil or the flexible net layer is designed and arranged in such a manner that blocks any lineal way of the macroparticles from the cathode to the substrate surface to be coated. In the case of using at least one flexible net layer, the net layer is preferably semi-transparent for ions and atoms, thus the macroparticle transport from the cathode to the substrate can be effectively inhibited.

The principle of the macroparticle filtering by using at least one flexible foil or at least one flexible net layer is based on the idea, that the macroparticles emitted by the cathode lose the highest amount of energy during impinging at the flexible foil or net layer. Thus the macroparticles finally drop to the bottom of the chamber and are firstly not incorporated in the growing film at the substrate surface and secondly not adhered on the surface of the flexible foil or net layer.

According to one embodiment of the present invention, in which the at least one filter component comprises a flexible foil, for which the transparency for macroparticles that are emitted in a straight way from the surface of the cathode to the substrate surface to be coated is essentially zero. For referring to this characteristic of the flexible foil in the context of the present invention, the term non-transparent will be used. Although in such a case the material flow in a straight way from the cathode to the substrate for all vaporized material is interrupted, it is still possible that enough plasma species including ionized material and neutral material arrives the substrate surface to be coated. Here, this behavior is referred to as "indirect ion trajectories".

It is important to understand that a flexible foil in the context of the present invention does not comprise any openings that are present in a flexible net or flexible net layer, as described in the following in more detail. Accordingly, in the present description of the invention, a flexible foil will be referred to be non-transparent, while a flexible net or flexible net layer will be referred to be semitransparent.

The flexible foil should further be thermally stable at process temperature. Likewise the flexible foil should exhibit a low sticking coefficient towards the cathode material to be evaporated for the reasons described above. In order to obtain these properties, the flexible foil can be made of thin metal sheets. Refractory metals, such as e.g. Nb, Ta, Mo, W or Re, as well as noble metals such as Ru, Os, Rh, Ir, Pd, Pt, Ag or Au, are preferably considered as foil materials. Also alloys among these metals or of any of these metals with another element of the periodic table are in the focus of the present invention. The thickness of the respective metal foils can depend on the material but should generally be lower than 0.5 mm to retain the flexibility of the foil. The material selection for the use as foil in the context of this invention can be undertaken by the skilled user in order to minimize the sticking coefficient of the cathode material towards the foil material. Further, the process environment such as e.g. absence or presence of gas atmosphere (e.g. reactive or non-reactive gas atmosphere) has to be taken into account for the material selection by the skilled user.

The advantage of such a flexible foil is that the transparency for macroparticles is essentially zero, while plasma species including ionized material and neutral material can bypass the flexible foil.

According to another preferred embodiment of the present invention, the macroparticle filter device comprises at least one flexible net layer, with low sticking coefficient for macroparticles, blocking any lineal way of the macroparticles from the cathode to the substrate surface to be coated. Such a combination of more than one flexible filter net layer shall be referred as filter net assembly in the following.

Figure 2:
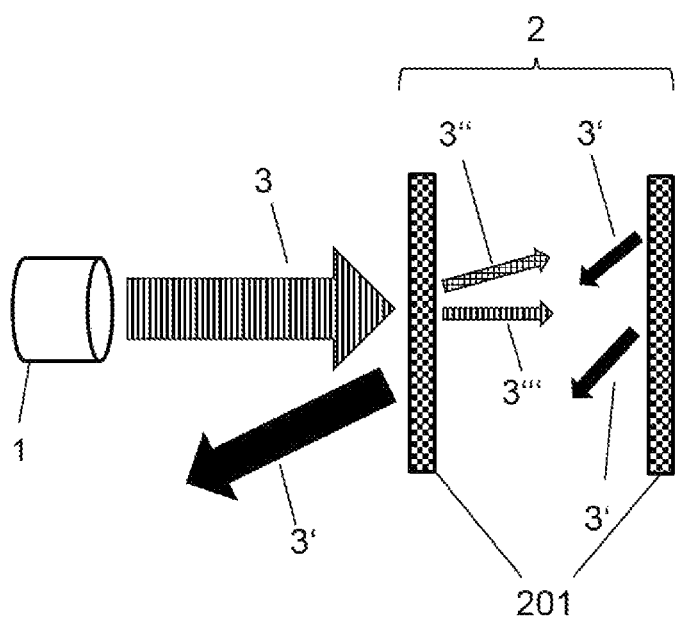

The macroparticle filter net assembly 2, can comprise for example at least one layer of a net-shaped fiber material 201 that is semi-transparent for ions and atoms but inhibits the macroparticle transport from the cathode 1 to the substrate 9, as schematically drawn in FIGS. 1 and 2. The ions and atoms can either be transmitted by the filter net assembly 2 and thus follow more or less direct trajectories 52 towards the substrate. Also ions which undergo a "non-direct" motion towards the substrate are schematically indicated as indirect ion trajectories 51, bypassing the filter net 2. Such ions can stem from e.g. emission at the target surface at an arbitrary angle or from gas species which are ionized in the vicinity of the target in reactive or non-reactive gas atmospheres.

The filter net assembly 2 comprises at least one flexible, thermally stable net layer 201 with low sticking tendency for the arriving macroparticles and acts as an energy or impuls absorber towards the arriving macroparticles as indicated in FIGS. 1 and 2. The macroparticles 3, emitted from the target surface of one or more arc evaporators 1, initially have a high velocity and/or energy when they arrive at the flexible filter net assembly 2. There the macroparticles 3 undergo inelastic collisions with the flexible net layers 201 and are thus either reflected 3', or diffracted by the net 3", which effectively reduces the kinetic energy of the macroparticles. To a small probability, some macroparticles 3''' can transmit a filter net layer 201, which are reflected 3' by the next filter net layer as schematically shown in FIG. 2. The macroparticles finally drop to the bottom of the chamber and are not incorporated in the growing film at the substrate surface.

The inventive macroparticle filter device can be applied to a multitude of different target materials and is suitable for reactive and non-reactive processes. Especially cathodic arc evaporation of high-$T_m$ cathode materials (e.g. $T_m$ is higher than 1200° C.), such as e.g. carbon or $TiB_2$ is regarded as a challenge, which should be especially addressed in this disclosure, though the inventive filter device can also be applied for metallic or composite cathode materials, comprising more than one element in the target.

In order to address the above mentioned phenomena, the present invention and preferred embodiments of the present invention will be explained in the following in more detail and exemplarily supported by figures. The following explanations and examples are not intended to limit the present invention but only to help to understand the invention and to show ways in which the invention can be put into practice.

FIGURE CAPTIONS

FIG. 1: A schematic drawing of a possible arrangement of arc evaporators (1), a thermally stable and flexible net filter assembly (2) blocking the direct line-of-sight towards a substrate (9). The macroparticle trajectories (3) are schematically indicated, as well as the ion trajectories of transmitted, direct (52) and diverted, indirect (51) ions.

FIG. 2: Represents a schematic drawing of macroparticle trajectories (3), which can involve reflection (3'), inelastic scattering (3") or even transmission (3''') at the one or more macroparticle filter net layers (201).

Figure 3:
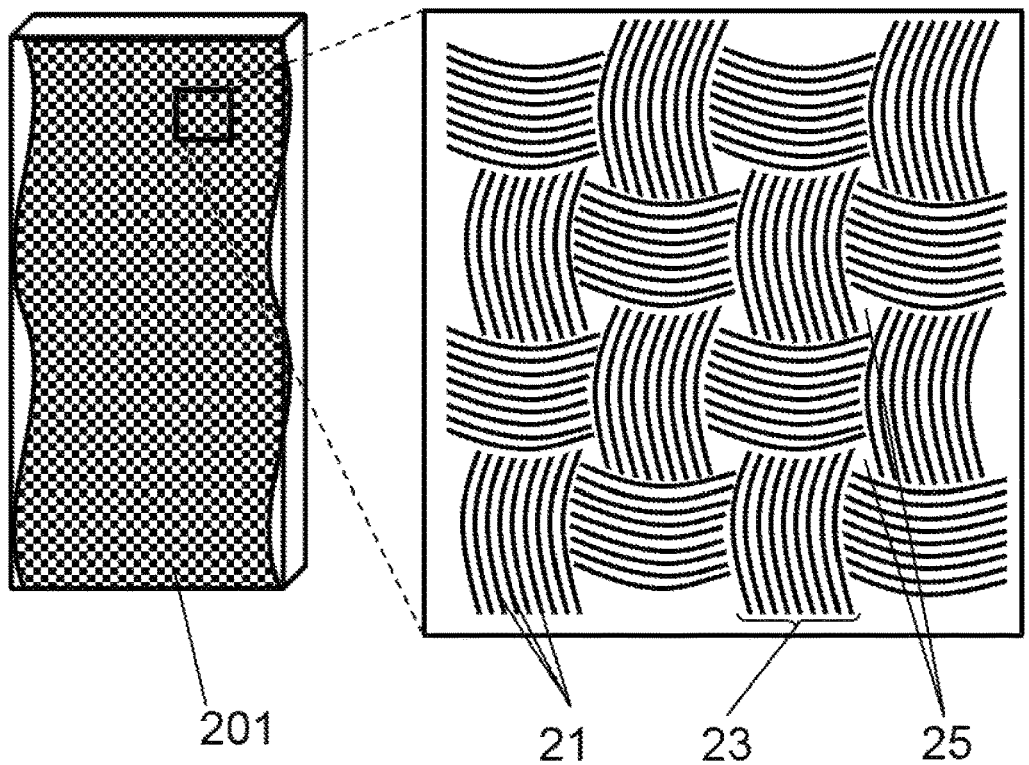

FIG. 3: Shows a schematic drawing of a woven fabric layer being used as a macroparticle filter net layer (201), comprising fibers (21), strings (23) and openings (25).

Figure 4:
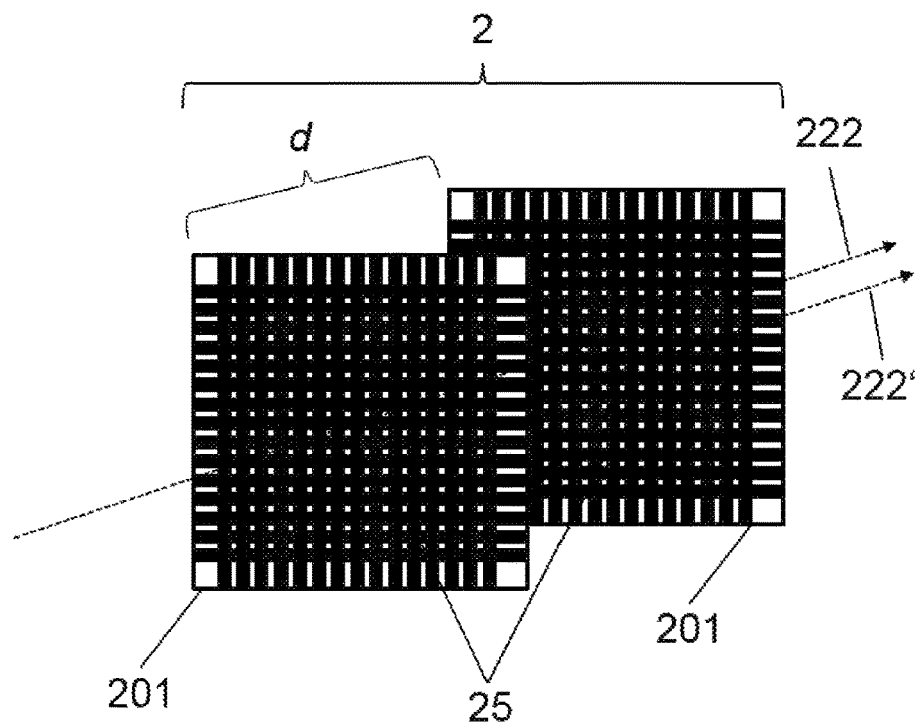

FIG. 4: Represents a schematic drawing of a macroparticle filter net assembly (2), comprising at least two macroparticle filter net layers (201), being arranged with a distance d and a lateral offset from the initial line-of-sight axis from target to substrate 222, which is indicated as 222'.

Figure 5:
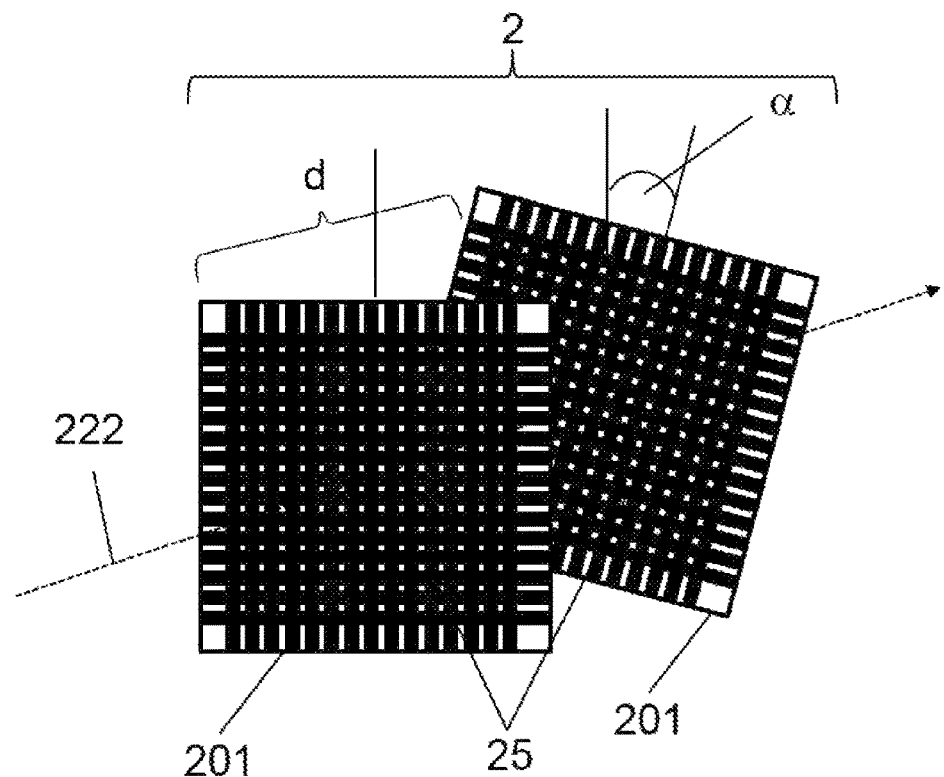

FIG. 5: Represents a schematic drawing of a macroparticle filter net assembly (2), comprising at least two macroparticle filter net layers (201), being arranged with a distance d and a rotation or tilt angle of at least one of the individual macroparticle filter net layers (201).

Figure 6:
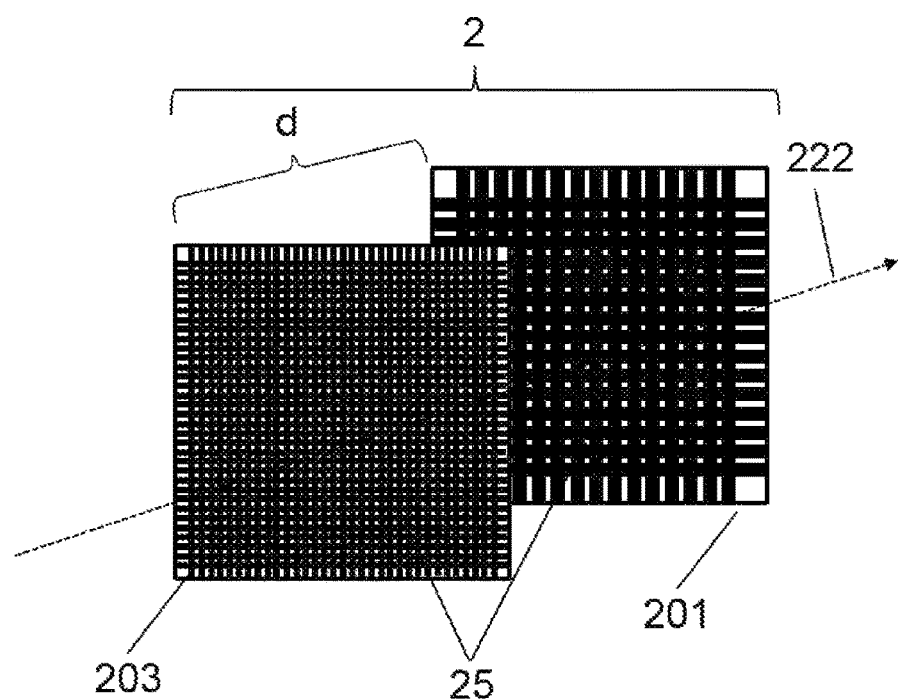

FIG. 6: Represents a schematic drawing of a macroparticle filter net assembly (2), comprising at least two macroparticle filter net layers (201) and (203), with different mesh size.

Figure 7:
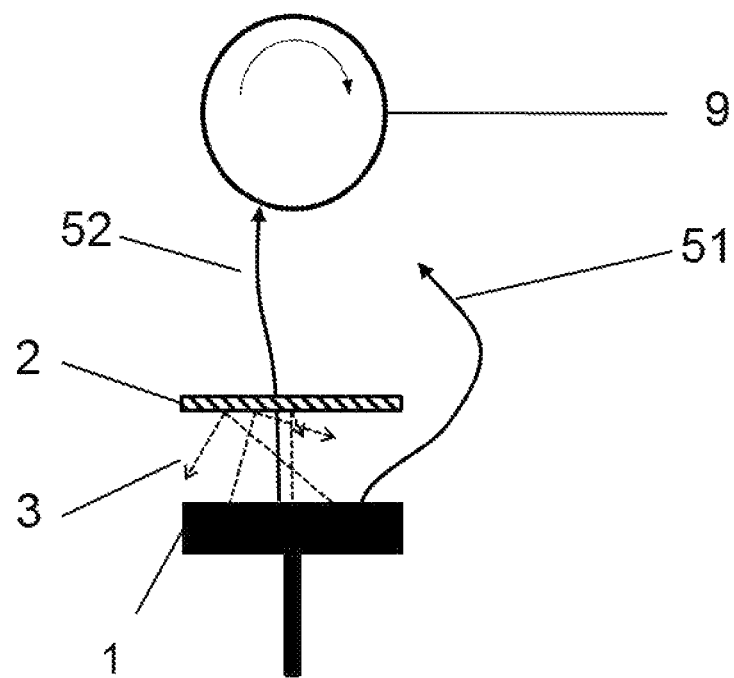

FIG. 7: Represents a schematic drawing of a macroparticle filter net assembly (2) in a planar geometry.

Figure 8:
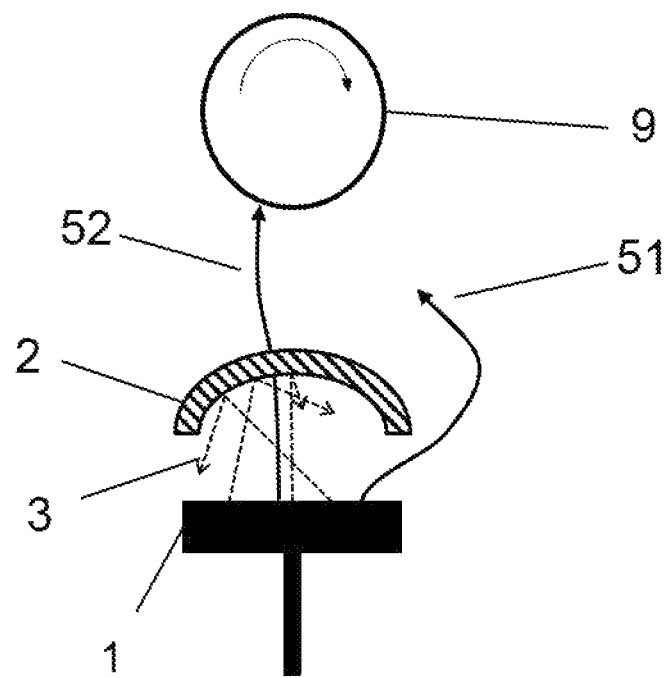

FIG. 8: Represents a schematic drawing of a macroparticle filter net assembly (2) in a bent geometry.

Figure 9:
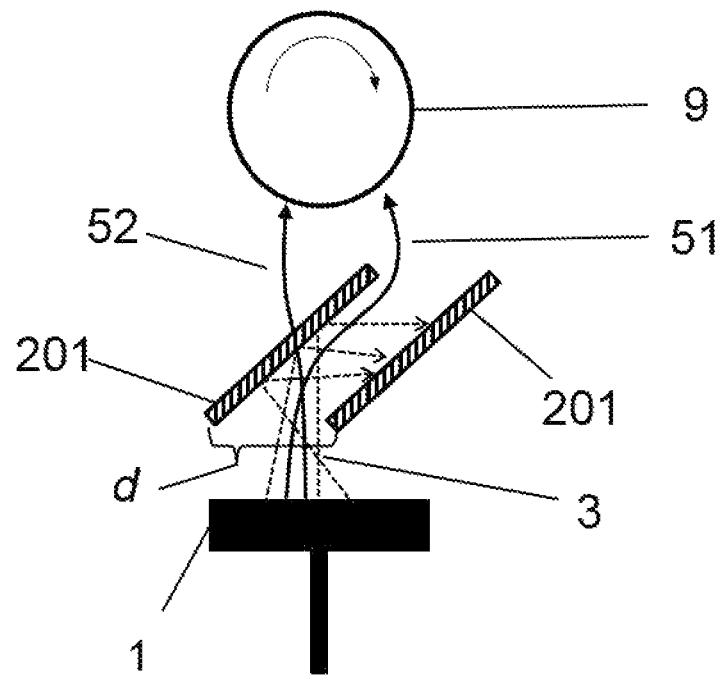

FIG. 9: Represents a schematic drawing of a macroparticle filter net assembly, comprising two macroparticle net filter layers (201) whose surface normals are inclined versus a direct line between target and substrate in order to block the direct line-of-sight for macroparticles from the target surface to the substrate surface.

Figure 10:
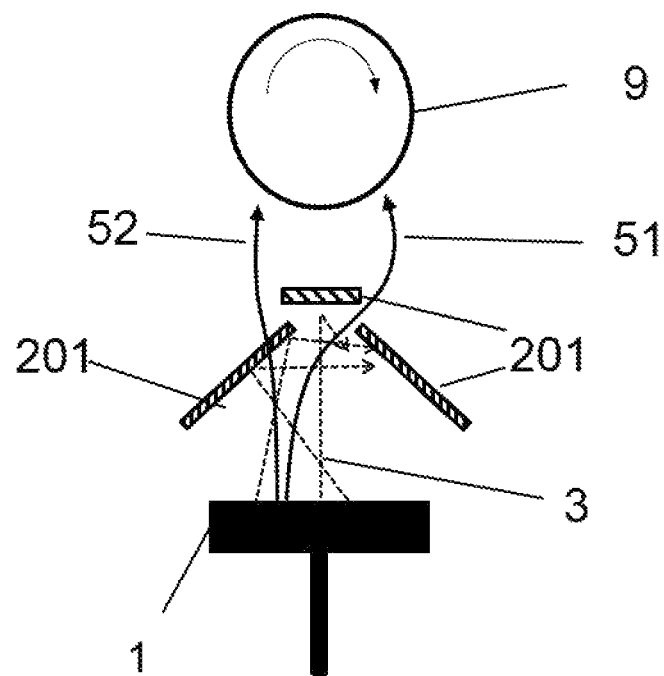

FIG. 10: Represents a schematic drawing of a macroparticle filter net assembly (2), whose macroparticle filter net layers are aligned in a funnel-shaped geometry.

Figure 11:
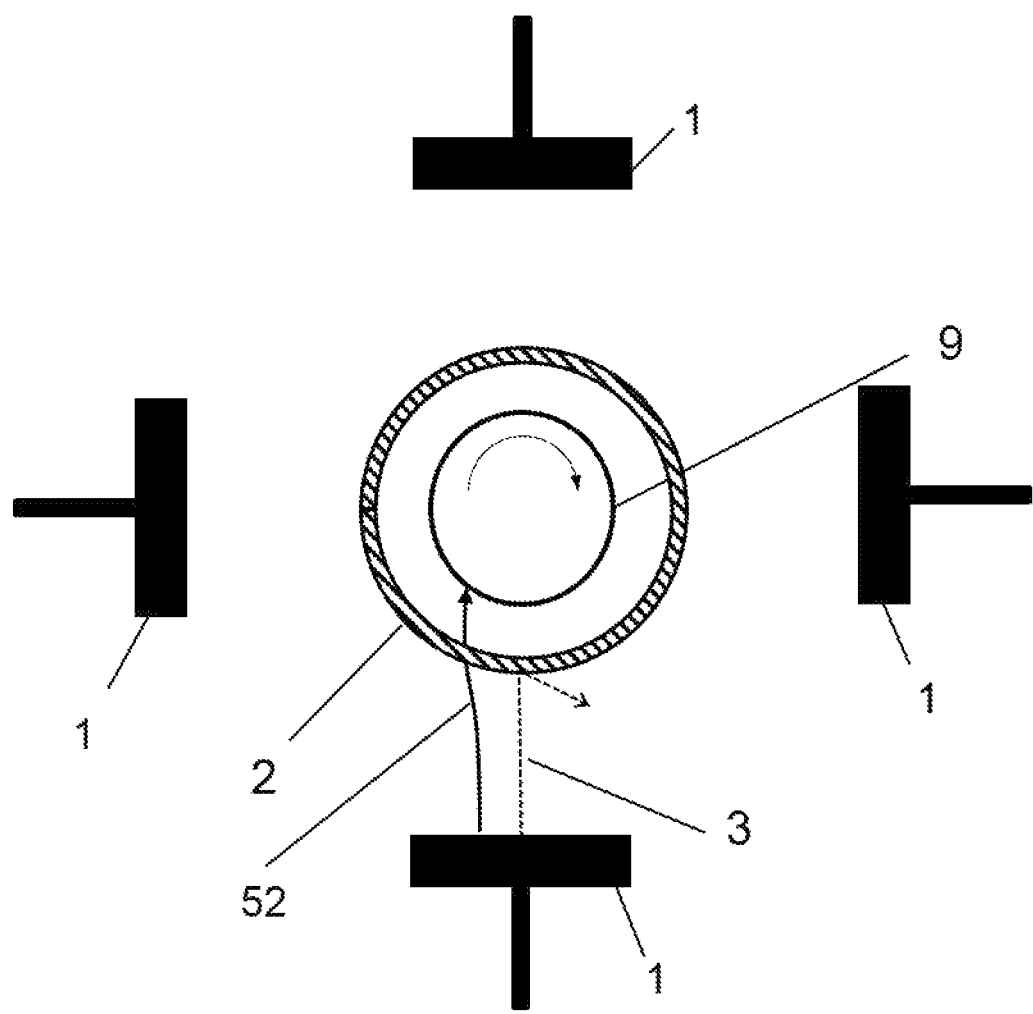

FIG. 11: Represents a schematic drawing of a macroparticle filter net assembly (2), which is located in direct proximity of the substrate (9). Substrate and filter rotation are possible in this geometric example.

FURTHER DETAILS AND PREFERRED EMBODIMENTS OF THE PRESENT INVENTION

The present invention effectively protects the substrate surface from macroparticles during deposition, by using at least one thermally stable foil or flexible net with a low sticking coefficient towards the impinging macroparticle material, which is arranged in a way that direct line-of-sight between cathode and substrate is prohibited. Although, the following explanations mostly refer to a more detailed description of possible arrangements of filter net layers, many of the given examples can be also applied analogously to the utilization of one or more flexible non-transparent foil, which should thus be regarded as a special case of the present invention.

In a preferred embodiment a net layer is composed of individual strings 23, comprising 10s to 1000s of individual fibers 21, from the group of carbon- or silicon based materials. An example of such a flexible net 201 is schematically presented in FIG. 3. The present invention emphasizes that the net (or mesh) of low-sticking material comprises multi-fiber assemblies which are arranged in a way to obtain a flexible network, which thus can absorb the high energy of impinging macroparticles.

In principle a whole layer of parallel fibers could be arranged and laid over layer by layer in order to obtain a more or less dense quire of flexible, low-sticking fibers. By number of layers overlaying each other, as well as adjusting the orientation of the parallel fibers of one layer to the next layer, the transparency for macroparticles and arriving coating material can be adjusted. This approach is however difficult to adjust for complex three-dimensional arrangements and other handling issues. The inventor thus found more suitable to use strings woven to fabrics. Such fabrics can be produced with almost arbitrary number of utilized strings, string orientation and/or resulting mesh size. A flexible net layer 201 produced from a woven fabric further comprises openings 25 between the multi-fiber assemblies or strings. The chosen example of FIG. 3 schematically represents a woven fabric of ~90° angle between the individual strings 23, or fibers 21, respectively, which should be understood as one possibility to obtain a suitable flexible net layer but not as a limitation of the current invention.

In one embodiment the woven fabrics are made of one material such as e.g. carbon, silicon carbide, aramid or glass. In the case that more than one fiber material is used for a net the term "hybrid woven fabric" should be introduced. Such woven products of either homogenous fabrics from e.g. carbon, glass or aramid fibers, or combinations therefrom in the case of hybrid fabrics, are nowadays commercially available and can be acquired e.g. by SGL Technologies GmbH, Germany.

Woven fabrics of e.g. carbon fibers are typically very thin and exhibit, depending on the utilized number of fibers per string, fiber diameter, their weaving direction and other parameters, a distinct permeability for impinging plasma species and particles. It is thus a preferred embodiment of the present invention that preferably more than one, but at least one, woven fabric layer 201 are overlaid each other before being provided to a flexible macroparticle filter component of the present invention. This approach is schematically indicated in FIGS. 4, 5, and 6.

The inventor's idea is to apply physical principles of optics, in particular of light refraction and diffraction, in combination with the principles of mechanics, in particular inelastic energy or momentum transfer, to be used for macroparticle filtering. Therefore, the inventor found that in line with optical principles, the overlay of two or more subsequent woven fabric layers, can result in a reduction of the transparency of the total macroparticle filter net, analogous to light interference in optics. This can be achieved by various combinations of individual woven fabric layers in order to minimize the transparency of the marcoparticle filter net assembly.

The following examples should thus not be seen as a limitation of the inventor's idea but provide some possible arrangements for adjusting the flexible, non-sticking macroparticle filter net assembly 2, comprising two or more layers of woven fabric net layers 201. The examples should not be limited to the indicated shape of the filters, the number of layers, or the like.

FIG. 4: In one example the flexible, non-sticking macroparticle filter net 2 comprises e.g. two layers of flexible woven fabrics 201, which are positioned after each other with a small spacing d between the individual woven fabric net layers. The spacing d can be e.g. several millimeters but could be also zero. One of the two woven fabric net layers 201 is thereby arranged with a slight lateral offset from the initial line-of-sight axis from target to substrate 222, which is indicated as 222'. This ensures that the macroparticles, which possibly pass a first flexible, woven fabric net layer through the openings 25, are "caught" by the second (or more) woven fabric net layers. The transparency of the total macro-particle filter net assembly 2 can thus be optimized in analogy to interference phenomena as explained above.

FIG. 5: In another example, the flexible, non-sticking macroparticle filter net assembly 2 comprises e.g. two layers of flexible woven fabrics 201, which are positioned with a small spacing d between the individual woven fabric net layers, after each other in line-of-sight from target to substrate 222. In this exemplary arrangement at least one layer is thereby slightly tilted with an arbitrary angle α, with respect to the vertical orientation of the strings from the first woven fabric net layer, which allows to adjust the transparency of the total macroparticle filter net assembly 2, as explained above.

FIG. 6: In another embodiment the flexible, non-sticking macroparticle filter net assembly 2 comprises e.g. two layers of flexible woven fabrics 201 and 203. The respective woven fabric layers exhibit different mesh size, e.g. attainable by different number or diameter of strings. In the examples shown, the woven fabric 203 exhibits double the number of strings, but with lower number of respective fibers per string, compared to the woven fabric 201. The resulting higher number but significantly smaller size of the openings 25 significantly reduce the transparency of the total filter net assembly 2 in analogy with the explanations above.

The above mentioned examples are meant to be applied individually, as well as any combination therefrom.

The inventor found that carbon fibers or silicon carbide fibers and other thermally stable materials are suitable for the inventive macro-particle filter net. The fiber material should exhibit a low adhesion for the evaporated material and can thus be selected with respect to the used specific target material. In the case of e.g. carbon or silicon carbide, the sticking tendency of many metals is very low due to their low adhesion forces towards molten or solid metal particles. Also other target materials, like carbon, TiB2 or WC exhibit a low sticking tendency to carbon fibers.

It is a further embodiment of the present invention, that the flexible, thermally stable sheet with low-sticking coefficient towards the molten or solid macroparticles can be effectively used in the case of multi-elemental targets, which comprise either a large difference in the melting temperature ($T_m$) of the individual elements, or likewise in the case where all target elements exhibit a very low or a very high $T_m$. In all cases the inventive macroparticle filter device effectively reduces the energy of the impinging macroparticles due to its flexibility. Further the sticking of molten species to the macroparticle filter net is mostly avoided due to the low sticking coefficient of the used sheet material. The multielement targets can essentially consist of any combination from the group of elements from the periodic table of elements, preferably group IV, V and VI, as well as Si, C, O, N and Al. The maintenance cycles of the inventive macroparticle filter device can thus be significantly prolonged.

As one example for vacuum arc processing of a typical high-$T_m$ material carbon (or C in the following) should be mentioned. Usually vacuum arc processing of graphite targets to obtain any kind of carbon coatings, such as tetragonal amorphous carbon (ta-C) or doped and dopant-free diamond like carbon coatings (e.g.: DLC, a-C:H, metal doped a-C:H), results not only in the generation of plasma, but also in a substantial amount of hard and elastic macroparticles, with high temperature and high kinetic energy. The incorporation of such C-macroparticles in the growing coating is however not desired, as they are mostly rigid when they arrive at the substrate surface and have a low sticking coefficient towards the substrate or growing film. Usually these C-macroparticles are embedded and overgrown by arriving C-vapor during coating growth, but they are not strongly bonded to the matrix of the coating. Still it remains difficult, as well as time- and cost-intensive, to reduce macroparticle-induced surface roughness after deposition by e.g. brushing. Using an inventive macroparticle filter device, comprising flexible, thermally stable filter foils or net layers with low sticking tendency towards carbon particles, can drastically reduce the number of arriving macroparticles at the substrate surface. If e.g. C-macroparticles exceeding a critical size of larger than 0.5 μm are regarded as critical for the coating quality, a combination of more than one woven fabric net layers with different mesh sizes allows for efficient reduction and selection of the arriving macroparticles exceeding this threshold value.

The same applies mutatis mutandis for all kinds of composite targets such as e.g. aluminium alloys (TiAl, AlCr, AlHf, NiAl, NiAlCr, . . . ) or tungsten alloys (e.g. WC, WMo . . . ), where the different or high $T_m$ of the individual elements or compounds exhibit a different tendency for macroparticle emission during vacuum arc processing.

Another aspect of the present invention is that the flexible, thermally stable macro-particle filter foil or net can thus consist of various materials as mentioned above, depending on the utilized gas atmospheres and process temperatures. In a preferred embodiment of the present invention, the flexible, thermally stable macro-particle filter device is used in inert atmosphere (e.g. Argon, or Neon gas atmospheres or vacuum conditions without process gas). Further, for operation of the inventive macroparticle device, the skilled user can chose a suitable materials for the sheet material, which does not deteriorate the mechanical and/or chemical properties due to physical or chemical reactions during reactive process atmospheres (such as e.g. Nitrogen, Oxygen, Acetylen). Thus it is possible to avoid oxidation of the sheet material, if for instance in the case of one or more woven fabric net layers are used, glass fibers are chosen instead of carbon fibers during operation in oxygen atmosphere.

Another embodiment of the inventive macro-particle filter device, comprising flexible, low-sticking and thermally stable foil or net layers, can be found in the great variety of process temperatures that can be used. Compared to state-of-the-art particle filters, such as e.g. Venetian blinds, the flexible character of the at least one foil or woven fabric layer, from a low-sticking, and thermally stable material exhibit a low thermal expansion. The inventive macro-particle filter device can thus be used at relatively low deposition temperatures, such as e.g. below 200° C. as used for temperature sensitive steels in automotive business, or even at lower temperatures e.g. 50° C., as well as at process temperatures exceeding 450° C. as used e.g. for cemented carbide cutting tools.

In some applications it can be useful to apply electric voltage to the macroparticle filter device in order to e.g. accelerate the charged plasma species towards the filter or alternatively to avoid static charging of the macroparticle filter device. It is thus an embodiment of the present invention that the sheet material can exhibit electrical conductivity.

It should further be mentioned that the inventive macroparticle filter device is not restricted to any magnetic configuration of the target. Random arc motion in this context means that a random movement of the arc on the target surface takes place, while controlled arc spot motion, also referred to steered arc, is controlled by e.g. an additional magnetic field in or close to the target surface. Both random and controlled arc motion are found to be suitable operation conditions for the inventive macroparticle filter device.

It is a general embodiment of the present invention that the macroparticle filter device is positioned between one or more arc evaporators 1 and one or more substrates 9, as exemplarily shown in FIG. 1, 2, 7, 8, 9, 10 or 11. Further, the inventive macroparticle filter device comprises one or more flexible sheets and a frame construction, which ensures the mechanical stability of the macroparticle filter sheets. This frame construction (not shown here) can be made of any metal, metal alloy, ceramic or composite material that is regarded suitable for the respective process environment, as to be judged by people skilled in the art. Preferred examples of the frame material are e.g. stainless steel, platinum, alumina, carbonfibre-reinforced materials.

In another embodiment of the present invention, the macroparticle filter device can be moved out of the direct-line-of-sight between the one or more arc evaporators and the one or more substrates. This movement can be performed, akin to shutter systems, by e.g. swinging the macroparticle filter device laterally or vertically out of the lineal direction from target to substrate. It is also possible to mount the flexible macroparticle filter foil or net on a frame construction, which can be collapsed by the operator or the system automatically in a certain process step. In the mentioned cases the macroparticle filter device is only active for a certain time of the whole process.

In principle, the indicated individual arc evaporators 1 can be all equipped with the same target material but the individual arc evaporators can also exhibit different target materials, depending on the intended coating composition and/or architecture.

In one embodiment of the present invention, the macroparticle filter foil or net assembly 2 should exhibit a lateral dimension of at least the approximate dimension of the one or more arc sources 1, as schematically drawn in FIG. 7 or 8. The inventive macroparticle filter net assembly 2 can be planar (FIG. 7) or bent (FIG. 8) and is thus not limited to any specific size or geometrical shape, as long as the condition of prohibiting a direct line-of-sight from target to substrate is satisfied. The same applies mutatis mutandis for the utilization of foil as flexible filter sheet.

In another embodiment of the present invention, the macroparticle filter net assembly 2 comprises at least two woven fabric layers 201, which are displaced from each other by a distance d in a manner, that the direct line-of-sight of the target to substrate is prohibited and the surface normal of the individual layers 201 is inclined versus a direct line between target and substrate. This enables macroparticle collisions at the individual filter net layers 201. If high-energy macroparticles undergo forward scattering, the macroparticles lose their energy at one or more of the filter net layers 201 and are thus not forwarded towards the substrate 9. This configuration can also be adopted to the utilization of foils instead of filter nets according to the description above.

Another possible arrangement of the inventive macroparticle filter net assembly 2 is exemplarily displayed in FIG. 10. There the macroparticle filter net assembly 2 comprises at least 3 individual filter layers 201, which are positioned in the shape of a funnel. This filter net arrangement effectively catches the macroparticles and allows for multi-collision cascades inside the inventive filter net, while "open" trajectories for ions 51 enable for a higher arrival rate of plasma species a the substrate surface 9.

Following the same inventive approach as before, the flexible, thermally stable macroparticle filter net assembly 2 blocks the direct line-of-sight from target to substrate. Here the macroparticle filter device can be placed near the substrate 9, in particular the macroparticle filter component can be mounted "together" with the substrate, on e.g. a carousel. The one or more substrate 9 can be mounted static in the vacuum chamber, but alternatively the substrates can undergo one-fold, two-fold or three-fold rotation. In this case the macroparticle filter device can be mounted in a manner that it also undergoes rotation. This can be achieved by utilization of sophisticated substrate fixture concepts, known to people skilled in the art. It is however a specific embodiment of the present invention that The macroparticle filter net 2 is thus not necessarily static within the vacuum chamber but can be mounted to undergo rotation during the process. This approach can also be realized if the macroparticle filter net assembly 2 surrounds the substrate 9 as indicated in FIG. 11.

The above mentioned embodiments can be realized solely or in combination with each other, without leaving the focus of the present invention.

In particular the present invention discloses:

A filter device for filtering macroparticles produced by cathodic arc evaporation in a vacuum coating chamber, wherein the filter device comprises at least one macroparticle filter component that can prevent macroparticles emitted during evaporation of a cathode comprised in an arc evaporation source to arrive a substrate surface placed in front of the cathode surface within the vacuum coating chamber, when the macroparticle filter component is placed between the cathode and the substrate surface, wherein the macroparticle filter component is provided as a frame construction with one or more flexible sheets, and having the particularity that one or more of the flexible sheets are provided as a filter net assembly comprising one or more flexible net layers.

In a preferred embodiment of the directly above mentioned filter device all flexible sheets are provided as a filter net assembly comprising one or more flexible net layers.

In a further preferred embodiment of the directly above mentioned filter devices the flexible filter net layers are made of one or more materials in such a manner that they exhibit a low sticking coefficient toward the cathode material to be evaporated, in particular low sticking coefficient toward cathode material comprising a carbon, boron or nitrogen based material and/or low sticking coefficient toward cathode material comprising a composite material being selected from groups IV, V and VI of the periodic table of elements, as well as Si, C, O, N and Al.

In one more preferred embodiment of the above mentioned filter devices the one or more macroparticle filter net layers comprise at least one woven fabric layer composed of one or more materials from the group of carbon, carbon based fiber materials, silicon carbide, silicon based fiber materials, aramid and glass. It is also possible and in some cases even desirable that all macroparticle filter net layers comprise woven fabric layers as mentioned above.

The one or more flexible sheets, preferably all sheets, should be made of one or more materials in such a manner that they exhibit thermal stability above 50° C.

For attaining a better flexibility it would be preferably that the above mentioned thermal stability can be above 300° C.

In some cases it can be convenient to provide at least one flexible sheet as flexible foil made of one or more materials in such a manner that they exhibit a low sticking coefficient toward the cathode material to be evaporated, in particular low sticking coefficient toward cathode material comprising a carbon, boron or nitrogen based material and/or low sticking coefficient toward cathode material comprising a composite material being selected from groups IV, V and VI of the periodic table of elements, as well as Si, C, O, N and Al.

In particular the one or more flexible foils can be made of a single metal or an alloy from the group of Nb, Ta, Mo, W, Re, Ru, Os, Rh, Ir, Pd, Pt, Ag, Au, or any alloy of one of them with another element from the periodic table.

Furthermore the present invention discloses:

A cathodic arc evaporation method, in which macroparticles produced by cathodic arc evaporation in a vacuum coating chamber are filtered, characterized in that for filtering the macroparticles one or more filter devices according to one of the above described embodiments are used, wherein at least one of the filter devices is placed between at least one arc evaporation source and at least substrate surface to be coated, wherein material is evaporated from a cathode comprised in the arc evaporation source and the filter device is placed in such a manner that the lineal way of the macroparticles from the cathode to the substrate surface to be coated is blocked.

According to a preferred embodiment of the inventive method mentioned directly above, the at least one of the filter devices placed between the at least one arc evaporation source and the at least one substrate surface to be coated comprises flexible sheets that are provided as a filter net assembly comprising one or more flexible net layers in such a manner that the transparency of the filter device has been adjusted by combination of filter net layers exhibiting different mesh size or different fiber diameter or different string number or different string orientation or a combination therefrom.

Preferably at least one cathode is made of material comprising a carbon, boron or nitrogen based material.

According to one preferred embodiment of the method described above at least one cathode is made of a composite material being selected from groups IV, V and VI of the periodic table of elements, as well as Si, C, O, N and Al.

According to a further preferred embodiment of the method described above, the cathode material comprises a melting point of higher than 1200° C.

According to one more preferred embodiment of the inventive method, one or more macroparticle filter components are provided in a manner that they surround the one or more substrate surfaces to be coated.

It can be also advantageously that at least one macroparticle filter component is mounted in a manner that rotatable motion of said macroparticle filter component is enabled and this macroparticle filter component is rotated during cathodic arc evaporation.

Furthermore, is can also ne advantageously that at least one filter device is mounted within the process chamber enabling motion of the filter device and the filter device is moved during cathodic arc evaporation in such a manner that the direct line-of-sight from the cathode being evaporated to the substrate surface to be coated is opened.

The invention claimed is:

1. Filter device for filtering macroparticles produced by cathodic arc evaporation in a vacuum coating chamber, wherein the filter device comprises at least one macroparticle filter component that can prevent macroparticles emitted during evaporation of a cathode comprised in an arc evaporation source from contacting a substrate surface placed in front of a cathode surface within the vacuum coating chamber, when the macroparticle filter component is placed between the cathode surface and the substrate surface, wherein the at least one macroparticle filter component is provided as a frame construction with two or more flexible sheets, wherein at least one of the flexible sheets is provided as a filter net assembly comprising one or more flexible net layers and at least one of the flexible sheets is provided as a flexible foil wherein the flexible foil is free of openings.

2. Filter device according to claim 1, wherein the one or more flexible net layers are made of one or more materials that are resistant to a cathode material adhering thereto.

3. Filter device according to claim 1, wherein the one or more flexible net layers comprise at least one woven fabric layer composed of one or more materials from the group of carbon, carbon based fiber materials, silicon carbide, silicon based fiber materials, aramid and glass.

4. Filter device according to claim 1, wherein the two or more flexible sheets are made of one or more materials in such a manner that they exhibit thermal stability above 50° C.

5. Filter device according to claim 4, wherein the thermal stability is above 300° C.

6. Filter device according to claim 1, wherein the flexible foil is made of one or more materials that are resistant to a cathode material adhering thereto.

7. Filter device according to claim 6, wherein the flexible foil is made of a single metal or an alloy from the group of Nb, Ta, Mo, W, Re, Ru, Os, Rh, Ir, Pd, Pt, Ag, Au, or any alloy of one of them with another element from the periodic table.

8. Cathodic arc evaporation method, in which macroparticles produced by cathodic arc evaporation in a vacuum coating chamber are filtered by one or more filter devices, wherein at least one of the filter devices is placed between at least one arc evaporation source and at least one substrate surface to be coated and comprises:

at least one macroparticle filter component that can prevent macroparticles emitted during evaporation of a cathode comprised in the at least one arc evaporation source from contacting the at least one substrate surface placed in front of a cathode surface within the vacuum coating chamber, when the at least one macroparticle filter component is placed between the cathode surface and the at least one substrate surface, wherein the at least one macroparticle filter component is provided as a frame construction with two or more flexible sheets, wherein at least one of the flexible sheets is provided as a filter net assembly comprising one or more flexible net layers and at least one of the flexible sheets is provided as a flexible foil wherein the flexible foil is free of openings, wherein material is evaporated from the cathode comprised in the arc evaporation source and the at least one of the filter devices is placed in such a manner that the lineal way of the macroparticles from the cathode to the at least one substrate surface to be coated is blocked.

9. Method according to claim 8, wherein the at least one of the filter devices placed between the at least one arc evaporation source and the at least one substrate surface to be coated comprises at least one flexible sheet that is provided as a filter net assembly comprising one or more flexible net layers in such a manner that the transparency of the at least one of the filter devices has been adjusted by combination of filter net layers exhibiting different mesh size or different fiber diameter or different string number or different string orientation or a combination therefrom.

10. Method according to claim 8, wherein the cathode is made of material comprising a carbon, boron or nitrogen based material.

11. Method according to claim 8, wherein the cathode is made of a composite material being selected from groups IV, V and VI of the periodic table of elements, as well as Si, C, O, N and Al.

12. Method according to claim 10, wherein the material of the cathode comprises a melting point of higher than 1200° C.

13. Method according to claim 8, wherein one or more of the at least one macroparticle filter component is provided in a manner that it surrounds the at least one substrate surface to be coated.

14. Method according to claim 8, wherein the at least one macroparticle filter component is mounted in a manner that rotatable motion of said at least one macroparticle filter component is enabled and the at least one macroparticle filter component is rotated during cathodic arc evaporation.

15. Method according to claim 8, wherein at least one of the filter devices is mounted within the process chamber enabling motion of the at least one of the filter devices and the at least one of the filter devices is moved during cathodic arc evaporation in such a manner that the direct line-of-sight from the cathode being evaporated to the at least one substrate surface to be coated is opened.

16. Filter device according to claim 2, wherein the cathode material comprises a carbon, boron or nitrogen based material and/or a composite material being selected from groups IV, V and VI of the periodic table of elements, as well as Si, C, O, N and Al.

17. Filter device according to claim 4, wherein each of the two or more flexible sheets is made of one or more materials in such a manner that they exhibit thermal stability above 50° C.

18. Filter device according to claim 6, wherein the cathode material comprises a carbon, boron or nitrogen based material and/or a composite material being selected from groups IV, V and VI of the periodic table of elements, as well as Si, C, O, N and Al.

\* \* \* \* \*